United States Patent [19]
Araki et al.

[11] Patent Number: 5,233,536
[45] Date of Patent: Aug. 3, 1993

[54] METHOD AND APPARATUS FOR PERFORATING A PRINTED CIRCUIT BOARD

[75] Inventors: Masatoshi Araki; Kiyoshi Okuda, both of Tokyo, Japan

[73] Assignee: Seikosha Co., Ltd., Tokyo, Japan

[21] Appl. No.: 675,372

[22] Filed: Mar. 26, 1991

[30] Foreign Application Priority Data

Mar. 26, 1990 [JP] Japan .................................. 2-76198

[51] Int. Cl.⁵ .......................... G06F 15/46; B26D 5/30
[52] U.S. Cl. .......................... 364/474.34; 364/474.35; 364/167.01; 356/375; 356/390; 356/401; 358/101
[58] Field of Search ................ 364/167.01, 474.34, 364/474.35, 560, 561; 358/101, 107; 356/375, 390, 401, 399; 29/432; 83/74, 364, 365

[56] References Cited

U.S. PATENT DOCUMENTS

| | | | |
|---|---|---|---|
| 4,481,533 | 11/1984 | Alzmann et al. | 358/101 |
| 4,568,971 | 2/1986 | Alzmann et al. | 358/101 |
| 4,641,828 | 2/1987 | Yajima | 271/227 |
| 4,817,477 | 4/1989 | Emery et al. | 83/23 |
| 4,829,375 | 5/1989 | Alzmann et al. | 358/101 |
| 4,866,629 | 9/1989 | Chen et al. | 364/468 |

FOREIGN PATENT DOCUMENTS

3519806 7/1986 Fed. Rep. of Germany.

*Primary Examiner*—Jerry Smith
*Assistant Examiner*—Paul Gordon
*Attorney, Agent, or Firm*—Jordan & Hamburg

[57] ABSTRACT

A method for perforating a printed circuit board on two perforating position identifying patterns using two perforating devices which have respective coordinate systems, wherein the two patterns are imaged by TV cameras. The pattern positions are detected by an image processing device with image signals. An inter-pattern spacing is calculated based on the detected values of the pattern positions, using an arithmetic circuit. An error between an inter-perforating-hole spacing and an inter-pattern spacing is calculated. Perforating positions are calculated from the patterns by the arithmetic circuit. A perforating control circuit controls the two perforating members to perforate at the printed circuit board at the same time.

4 Claims, 10 Drawing Sheets

METHOD AND APPARATUS FOR PERFORATING A PRINTED CIRCUIT BOARD

FIELD OF THE INVENTION

This invention relates to a method and apparatus for perforating holes in a printed circuit board, and is especially directed to the mounting or positioning of a circuit element employing reference patterns for identifying preformed perforating positions on the printed circuit board.

BACKGROUND OF THE INVENTION

In known methods for perforating a printed circuit board, reference patterns for identifying perforating positions formed on the printed circuit board are imaged by TV cameras. The image signals thereof are stored. Based on these image signals, central positions of the patterns are calculated by an image processing device. The central positions of the patterns are perforated after moving the printed circuit board on XY tables in XY directions in accordance with the calculated values.

When perforating a plurality of holes in a single printed circuit board, each perforationg is made in one portion of the board in the method described above. After moving the printed circuit board, the next hole is bored by the same method.

In the conventional perforating method, only one perforating device is employed. Therefore, when a plurality of positioning holes are perforated in the single printed circuit board, the same operation has to be carried out two or more times. If there is an error between the patterns indicating the perforating positions, the perforations are directly effected. This exerts an influence on an the accuracy of perforating of lands of the wiring patterns, which is to be effected in the next step.

SUMMARY OF THE INVENTION

Accordingly, it is an object of the invention to provide a perforating method and apparatus for simultaneously perforating two holes by equally correcting any error at the time of perforating the board, if there is an error between reference patterns for identifying perforating positions.

In order to accomplish this object, in accordance with the invention, a method for perforating a printed circuit board with a pair of perforating device uses at least two reference patterns for identifying preformed positions on the printed circuit board, comprises the steps of:

imaging two reference patterns for identifying perforating positions on the printed circuit board using of TV cameras;

detecting respective positions of the patterns with an image processing device using image signals obtained when the TV cameras effect imaging;

calculating a spacing between the patterns in accordance with the result of detection of the pattern positions;

calculating an error between a prestored inter-perforating-hole spacing and a calculated inter-pattern spacing;

calculating perforating positions from the patterns which are, after the error has been halved, corrected by the halved values; and moving the perforating members, which are disposed on XY tables provided in each of the perforating device, to said perforating positions, and causing said perforating members to perforate the printed circuit board.

The perforating method of the invention may further include the steps of employing a standard gauge having two holes perforated at a predetermined spacing, imaging two holes with the pair of TV cameras, detecting positions of the two holes with the image processing device and calculating the spacing between the pair of TV cameras using the results of the detection.

A perforating apparatus for perforating a printed circuit board using at least two reference patterns for identifying preformed positions on the printed circuit board, in accordance with the invention, comprises a pair of perforating devices that are relatively movable with respect to one another and that have perforating members on XY tables and TV cameras mounted opposite to the perforating member with the printed circuit board therebetween, so that the TV cameras can image the patterns.

The perforating apparatus also includes:

an image processing device for detecting the positions of the patterns in accordance with image signals obtained when the TV cameras images the patterns;

an arithmetic circuit for calculating the inter-pattern spacing in accordance with the result of the detection of the pattern positions, and for calculation og an error between an inter-perforating-hole spacing and the inter-pattern spacing, and for calculating perforation positions from the patterns, which are, after halving the error, corrected by the half values; and a perforating control circuit for moving the perforating members to the perforating positions by the XY tables, and causing the perforating members to perforate the printed circuit board.

The perforating apparatus of the invention is provided with a standard gauge formed with two holes at a predetermined spacing, and the image processing device further incorporates means for detecting the positions of the two holes imaged by the pair of TV cameras.

The arithmetic circuit further calculates the spacing between the pair of TV cameras using the the results of the detection of the positions of the two holes.

BRIEF DESCRIPTION OF THE DRAWINGS

In order that the invention may be more clearly understood, it will now be disclosed in greater detail with reference to the accompanying drawing, wherein.

DESCRIPTION OF THE PREFERRED EMBODIMENTS

Figure 8:
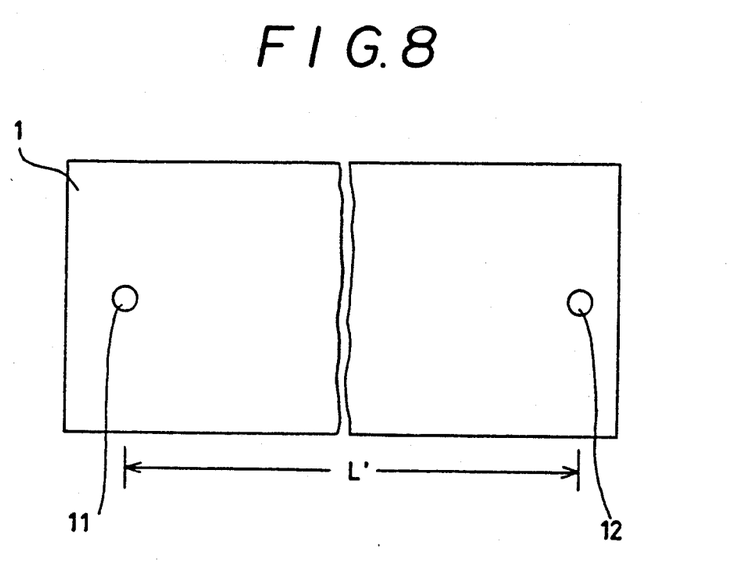
FIG. 8 is a partially cut-away plan view of a printed circuit board.

Referring now to FIG. 8, a lead pattern of copper (not illustrated) is formed on a printed circuit board 1. Copper-based reference patterns 11, 12 are formed thereon for identifying positions to be perforated. Spacing L' between the reference patterns 11, 12 includes a perforating spacing L and an error derived from a deformation of the printed circuit board during or after printing, etc.

Figure 1:
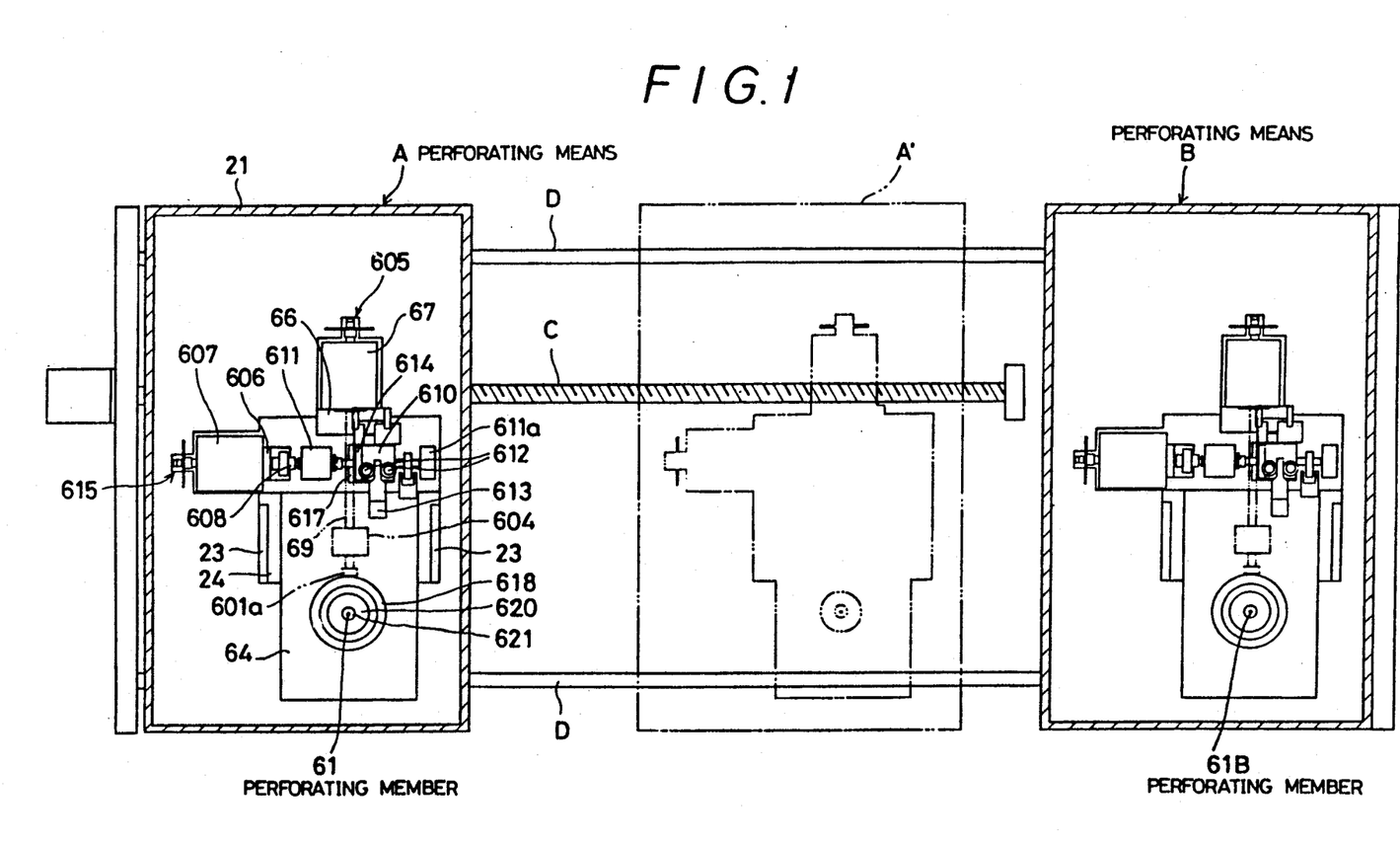
FIG. 1 is a partially cross sectional plan view of an apparatus in accordance with the invention, taken substantially along the line E—E of FIG. 3.

As illustrated in FIG. 1, the perforating apparatus of the invention perforates a board with a pair of perforating devices A, B. These two perforating devices are movable with respect to one another. In this embodiment, the first perforating device A is movably mounted, while the second perforating device B is fixedly mounted. Upon rotation of the screw C, rollers R (shown in FIG. 2) on a bottom face of the device A roll on rails D, D and the perforating device A can move toward and away from the position A' (illustrated in dash-dot lines). This arrangement permits adjustment of the a spacing between the pair of perforating devices A, B so that the system is adaptable to a variety of printed circuit boards having different perforation spacings. Thus, printed circuit boards have a variety of sizes, and the perforation spacings differ from one another other. The perforating devices A, B include perforating drills 61, 61B mounted on XY tables. The positions of the respective drills are finely adjustable in XY directions. The first and second perforating devices A, B have identical structures. Therefore, the structure of only one of these devices, e.g., the perforating device A, will be explained in detail.

Figure 2:
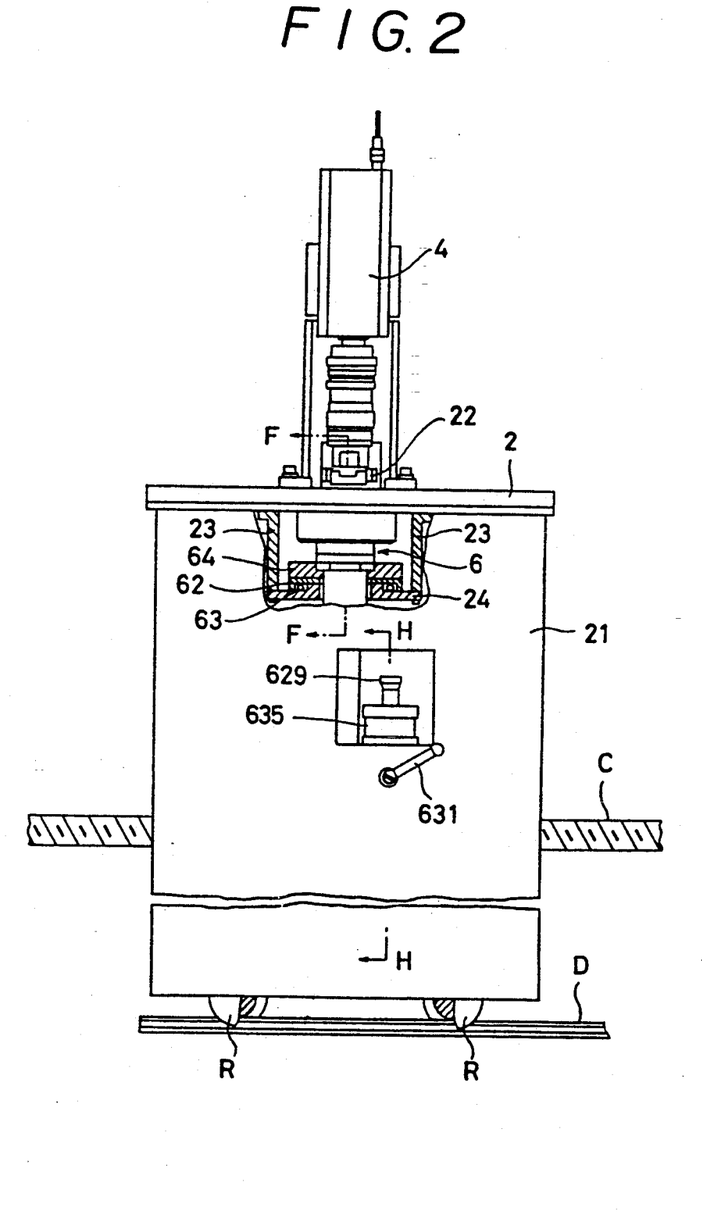
FIG. 2 is a partially cut-away front elevation illustrating a first perforating device A in the embodiment of FIG. 1.
Figure 3:
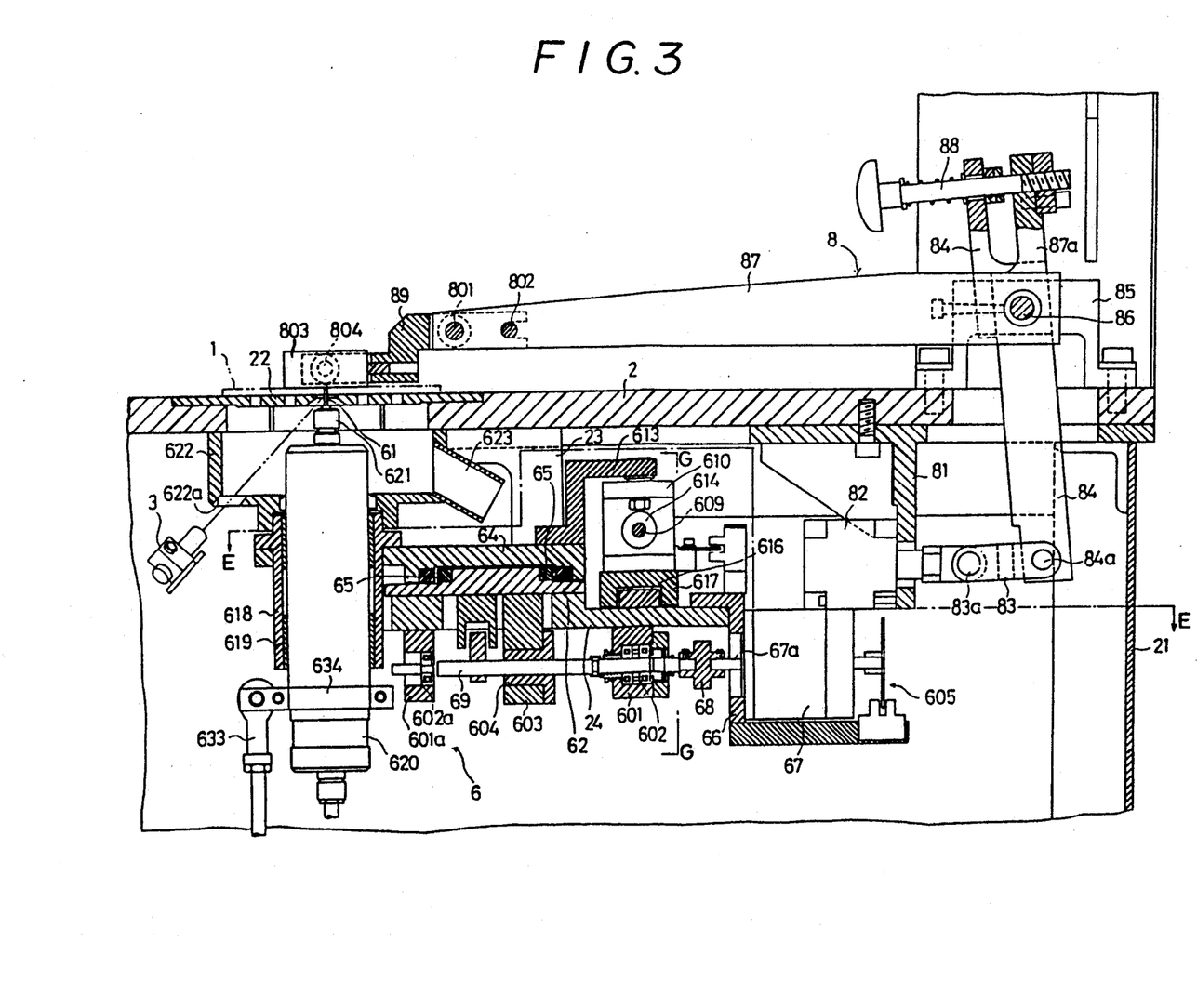
FIG. 3 is an enlarged sectional view taken substantially along the line F—F of FIG. 2.

FIGS. 2 and 3 are a partially cut-away front elevation and an enlarged sectional view, respectively, each illustrating the perforating device A. A work table 2 is fixedly mounted on an upper surface of a case 21. A mounting cover 22 for the printed circuit board 1 is provided on the work table 2, the work table 2 being adapted to move horizontally between the drill 61 and a TV camera 4 disposed opposite to the drill. The printed circuit board 1 is fixedly mounted in the mounting cover 22 by a printed circuit board holding device 8, which will be discussed later.

Figure 6:
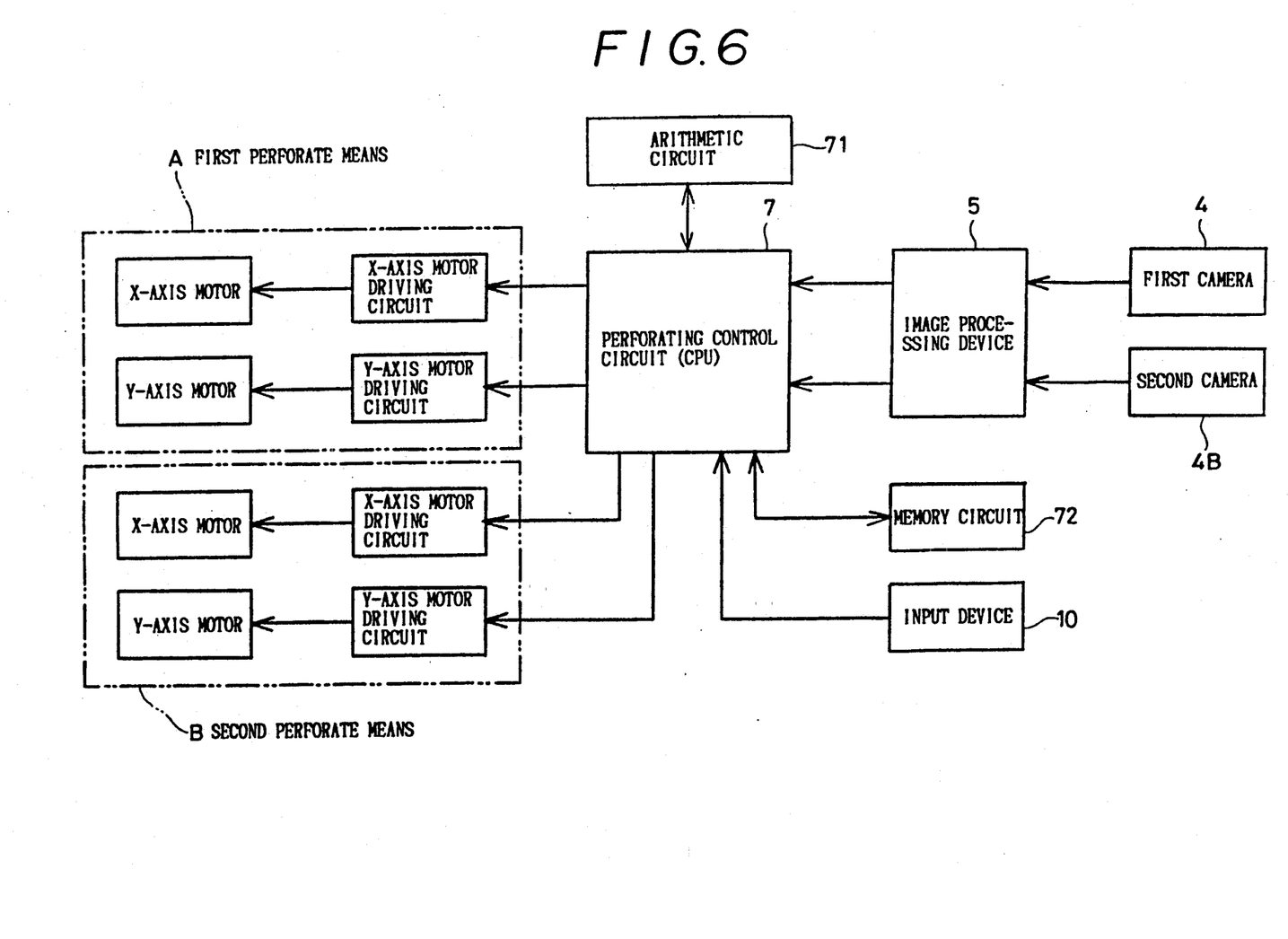
FIG. 6 is a block diagram depicting an apparatus in accordance with the this invention.

A light emitting device 3 mounted obliquely beneath the table 2 emits a light toward the printed circuit board 1 on the mounting cover 22. The reference patterns for identifying the perforating positions 11, 12 are imaged by TV cameras positioned above the table 2, i.e., the first TV camera 4 and a second TV camera 4B illustrated in FIG. 6. Image signals obtained when these TV cameras image the printed circuit board are processed by an image processing device 5, so that central positions thereof are thus detected. The detected values are applied to a perforating control circuit (CPU) 7. An arithmetic operation which will be hereinafter discussed, is carried out by an arithmetic circuit, using the detected values. The calculated value is supplied to the CPU 7 and is stored at the same time in a memory circuit 72. The CPU 7 controls the driving of the XY tables of the perforating devices A, B. An input device 10 is capable of inputting (presetting) data of the spacing L between the holes to be formed or the like, to the CPU 7. The spacing L is then stored in the memory circuit 72.

A shifting device 6 is provided to shift the drill 61 in the XY directions. As illustrated in FIGS. 2 and 3, support plates 23, 23 are attached to the underside of the work table 2. A base 24 is fixed to the lower end thereof. A Y table 62 is provided on the base 24 to be movable in the Y direction by a cross roller guide 63. An X table 64 is provided on the Y table to be movable in the X direction by a cross roller guide 65. In order to move the Y table 62, as depicted in FIG. 3, a Y-axis motor 67 is mounted on a mounting plate 66 secured to the end of the base 24. A Y driving shaft 69 is connected via a coupling 68 to a motor shaft 67a. A ball screw (not illustrated) is cut in the outer periphery of the Y driving shaft 69. The Y driving shaft 69 is rotatably supported via bearings 602, 602a on support members 601, 601a fixed to the underside of the base 24. A connecting plate 603, to which a nut 604 for a ball screw is fixed, is fixed to the underside of the Y table 62. The ball screw nut 604 is fitted to the middle of the Y driving shaft 69. The nut 604 is moved in the direction Y with rotations of the Y driving shaft 69. The Y table 62 is thereby movable in the Y direction. The numeral 605 designates an axial sensor for setting an origin of the Y-axis motor 67.

Figure 4:
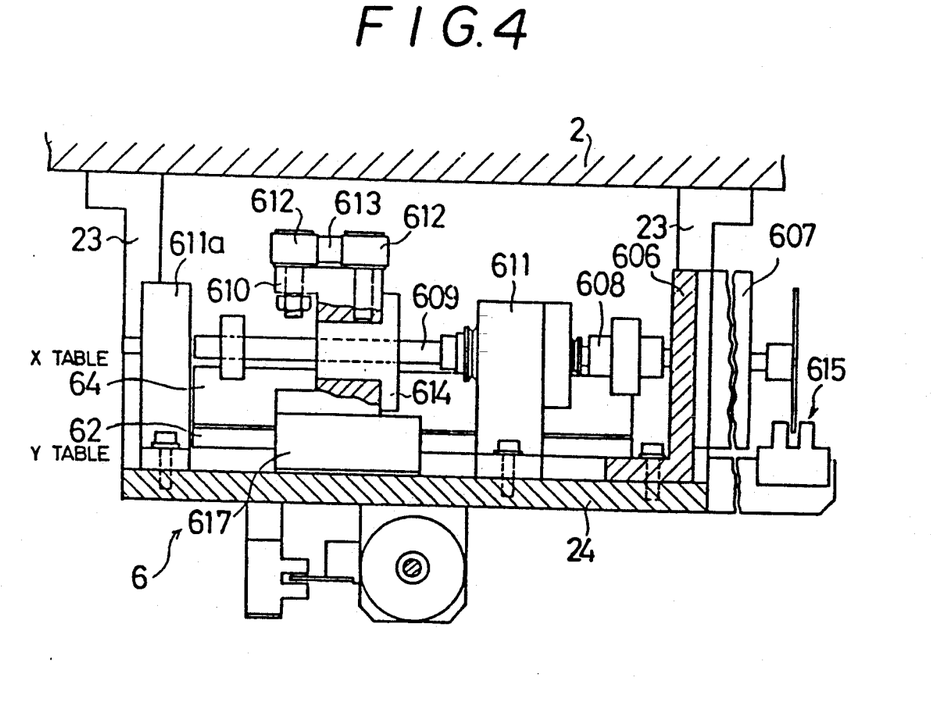
FIG. 4 is a sectional view taken substantially along the line G—G of FIG. 3.

In order to move the X table 65, as illustrated in FIGS. 3 and 4, an X-axis motor 607 is mounted on a mounting plate 606 secured to the base 24. An X driving shaft 609 is connected via a coupling 608 to the motor shaft. The outer periphery of the X driving shaft 609 is cut to form a ball screw (not illustrated). The X driving shaft 609 is rotatably supported via bearings on support members 611, 611a fixed to the upper surface of the base 24. A connecting lever 613 is fixed onto the upper surface of the X table 64.

A ball screw nut 614 fitted to the middle of the X driving shaft 609 is affixed to a connecting member 610. The top end of the connecting lever 613 is sandwiched between pins 612, 612 attached to the upper surface of the connecting member 610. The connecting member 610 is connected to linear ball slider 617 movable in the X direction along a guide 616 provided on the upper surface of the base 24.

The ball screw nut 614 moves in the X direction with rotation of the X driving shaft 609. The connecting member 610, the pins 612 and an interlocking lever 613 interlock therewith. The X table 64 is thereby movable in the X direction. The numeral 615 denotes an axial sensor for setting the origin of an X-axis motor 607.

As illustrated in FIG. 3, a cylindrical mounting member 618 is fixed to penetrate the front end portion of the X table 64. A spindle motor 620 penetrates this mounting member so that the motor 620 is movable up and down through a slide bearing 619. A collet chuck 621 is provided at the upper end of the spindle motor 620. The collet chuck 621 is fitted with the drill 61.

A chip cover 622 is affixed to the upper end of the mounting member 618. The chip cover 622 is formed partly with a hole 622a, whereby light emerging from the light emitting device 3 is not blocked. The cover 622 is provided with a duct 623 through which chips are sucked by a vacuum pump.

Figure 5:
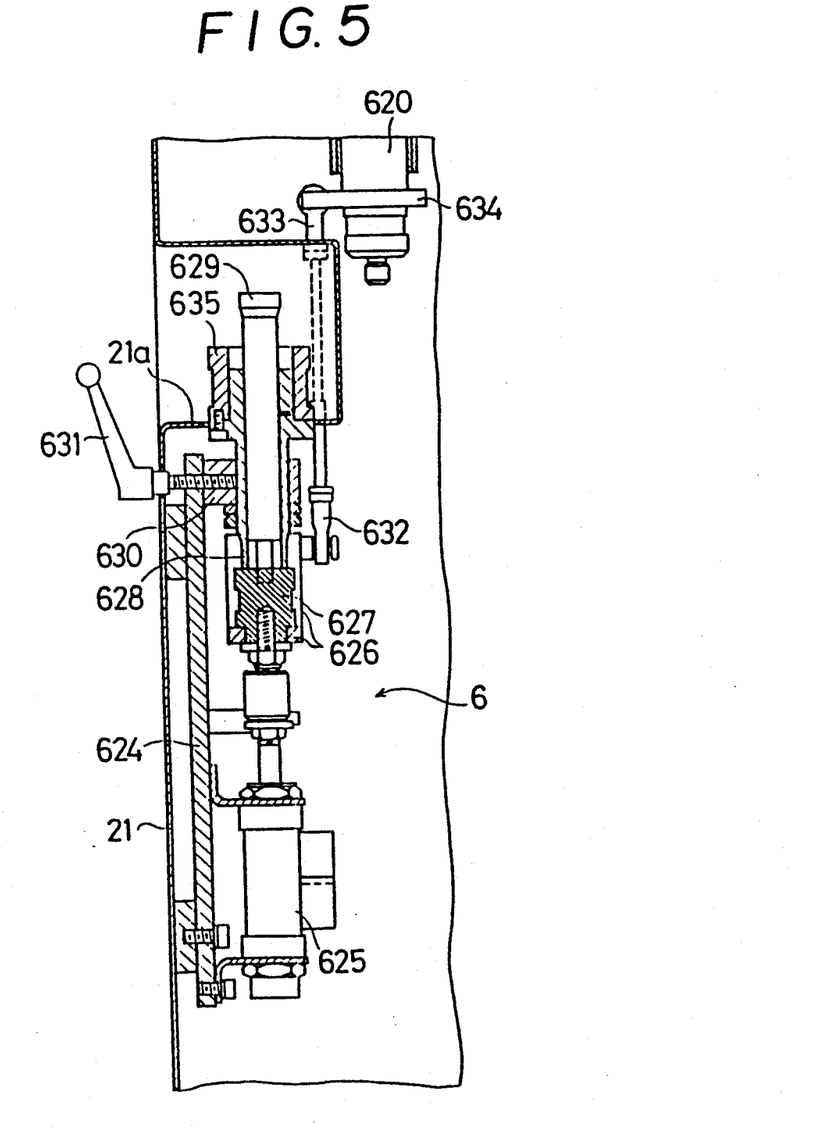
FIG. 5 is an sectional enlarged view taken substantially along the line H—H of FIG. 2.

FIG. 5 depicts a device for moving forward (raising) the drill 61 and adjusting the height of the top end thereof. A support plate 624 is affixed to an internal surface of the case 21. An air cylinder 625 is mounted on a lower end portion of the support plate. A connecting member 626 is affixed to an upper end of a shaft of the air cylinder using a stopping member 627. The reference numeral 628 designates a cylindrical stopper to which an oil damper 629 is fitted. A lower end of the oil damper 629 can impinge on the stopping member 627. A retaining plate 630 of the stopper 628 is provided at an upper end of the support plate 624. A shaft of a clamp lever 631, positioned outwardly of the case 21, is screwed into the retaining plate 630. The top end of the lever 631 retains the stopper 628 in a predetermined position. One end portion of the connecting member 626 is L-shaped and is connected to a lower connecting shaft 632. An upper connecting shaft 633 is connected to a holder 634 wind-fastened to a lower end of the spindle motor 620. The case 21a has a recess 21a. A head portion of the oil damper 629 and an operating portion 635 connected to an upper end of the stopper 628 are positioned in this recess 21a. These components are externally operated.

After attaching the drill 61 to the collet chuck 621, the height of the drill is adjusted. At this time, the clamp lever 631 is slackened to depress or raise the operating portion 635 disclosed in the recess 21a. The position of the lower end of the stopper 628 is thereby moved up and down. The highest position of the stopping member 62 is thus restricted.

In order to mount the printed circuit board to the work table, a printed circuit board holding device, as illustrated in FIG. 3, includes a mounting plate 8 affixed to the underside of the work table 2. A cylinder 82 is affixed to this mounting plate. Connecting rods 83, 84 are sequentially swingable connected via pins 83a, 84a to the top end of the shaft of the cylinder 82. The rod 84 is supported on a support plate 85 affixed to the upper surface of the table so as to be swingable about a shaft 86. An arm 87 is swingably supported on the shaft 86. The rod 84 is linked via a spring pin 88 to an upper end of an arm 87a connected to the arm 87 and extending upwards. The front end of the arm 87 is caught by a forked presser lever 89 and connected thereto through pins 801, 802. The front end of the press lever 89 is substantially U-shaped and lies in a plane. A ring-like presser tip 803 is swingably connected via a pin 804 to the front end of the lever 89.

The printed circuit board 1 is now placed in a predetermined position on the cover 22, and a start switch (not illustrated) is turned ON. The cylinder 82 is thereby actuated, and its shaft moves forwards. The lower end of the connecting rod 84 is pushed through the connecting rod 83 and swung about the shaft 86, to the position indicated by a solid line in FIG. 3. As a result, the front end of the arm 87 is lowered, and the press tip 803 descends correspondingly. The printed circuit board 1 is held and thus fixed. A lower surface of the press tip 803 uniformly holds the upper surface of the printed circuit board 1. No biasing force acts on the printed circuit board.

According to the invention, the two reference patterns for identifying perforating positions 11, 12 are simultaneously detected. The inter-pattern spacing L' is calculated. An error between the spacing L' and the inter-perforating-hole spacing L is also calculated. This error is then halved. Perforating positions, which have been corrected by the halved values, are calculated from the patterns. The error is allocated to the two perforating positions, and perforation of the circuit board is then effected.

The arithmetic operation performed by the arithmetic circuit 71 will now be explained.

Figure 9:
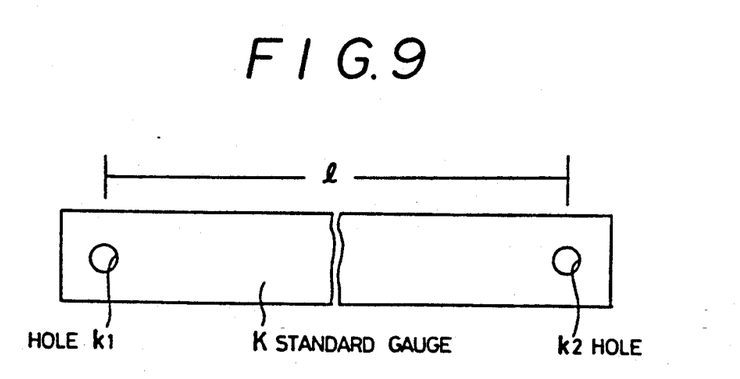
FIG. 9 is a partially cut-away plan view of a standard gauge.

FIG. 9 illustrates a standard gauge K having two holes k1, k2 perforated at a precise predetermined spacing 1.

Figure 10:
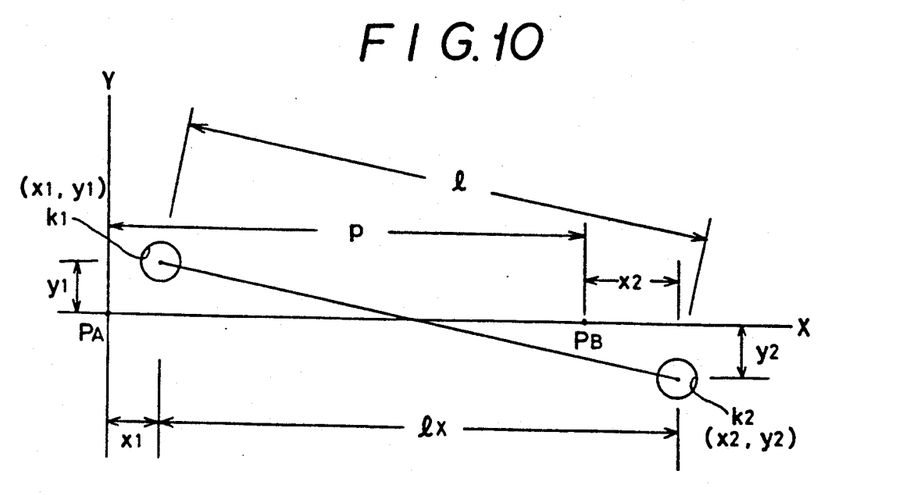
FIGS. 10 to 13 are explanatory drawings of calculation examples using the arithmetic circuit of the invention.

As depicted in FIG. 10, the standard gauge K is set in the pair of perforating devices A, B. The positions of a pair of TV cameras are now indicated by PA, PB. It is assumed that a line extending between the two cameras is defines an X-axis, while a line orthogonal thereto defines a Y-axis. The letter p represents the spacing between the two TV cameras. The letter 1 indicates the spacing between the two holes of the standard gauge K. The spacing in the X-axial direction between the two holes is expressed by 1X, while the spacing in the Y-axial direction therebetween is expressed by 1Y. The two holes k1, k2 are imaged using the pair of TV cameras. The image processing device 5 detects coordinates (x1, y1) of the hole k1 and coordinates (x2, y2) of the hole k2. Based upon these detected values, the spacing p between the TV cameras is calculated as follows:

$$lY = y2 - y1$$

$$lX = \sqrt{l^2 - (Y2 - y1)^2}$$

$$p = lX - (x2 - x1)$$
$$= \sqrt{l^2 - (y2 - y1)^2} - (x2 - x1)$$

The perforating device A now moves a distance equivalent to a difference (L−p) between the inter-perforated-hole spacing L and the inter-TV-camera spacing p. Upon this movement, the spacing between the TV cameras PA, PB is made to coincide with L.

Figure 11:
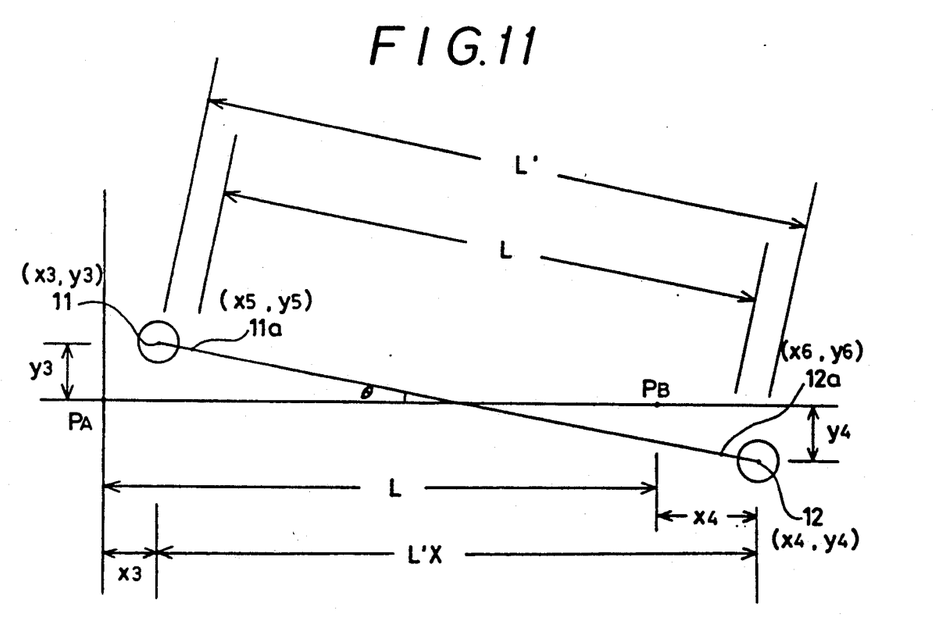

The printed circuit board 1 to be perforated is subsequently set in the two perforating devices A, B. The reference patterns for identifying perforating positions 11, 12 are imaged. As illustrated in FIG. 11, the image processing device 5 detects central coordinates (x3, y3) of the pattern 11 and also central coordinates (x4, y4) of the pattern 12. The spacing L' between the two patterns is calculated using these detected values. Namely, the spacing in the X-axial direction of the spacing L' is given by:

$$L'X = L + (x4 - x3)$$
$$L'^2 = (L'x)^2 + (y4 - y3)^2$$
$$= \{L + (x4 - x3)\}^2 + (y4 - y3)^2$$

then $$L' = \sqrt{\{L + (x4 - x3)\}^2 + (y4 - y3)^2} \quad (1)$$

The inter-pattern spacing L' is calculated in this manner.

With respect to the thus calculated spacing L', the positions of holes 11a, 12a having the perforating spacing L are then calculated. In this case, an error between spacing L' and L is allocated evenly to both sides, thereby determining the perforating positions.

Figure 12:
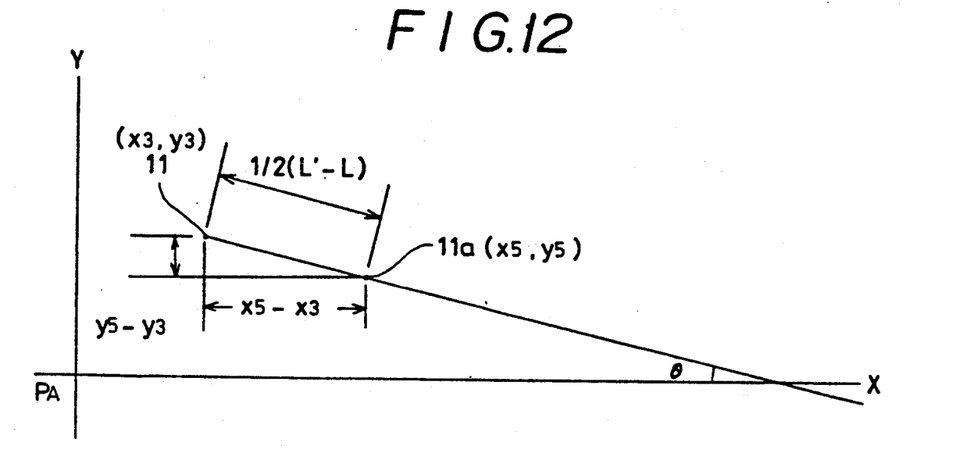

FIG. 12 illustrates an enlarged view of one hole 11a. Using the TV camera PA, assuming that (x5, y5) are the central coordinates of the hole 11a to be formed after correcting the error in accordance with the coordinates (x3, y3) of the pattern 11, and assuming that 0 is the angle made by the line connecting the patterns 11, 12 and X-axis, the following relations are attained:

$$x5 - x3 = (L' - L)/2 \times \cos\Theta$$
$$x5 - y3 = (L' - L)/2 \times \sin\Theta$$
when
$$\tan\Theta = a$$

$$\cos\Theta = 1/\sqrt{1 + a^2}$$

$$\sin\Theta = a/\sqrt{1 + a^2}$$

$$x5 = x3 + (L' - L)/(2\sqrt{1 + a^2}) \quad (2)$$

$$y5 = y3 + a(L' - L)/(2\sqrt{1 + a^2}) \quad (3)$$

where $$a = (y4 - y3)/(L + x4 - x3)$$
$$= (y5 - y3)/(x5 - x3)$$

Similarly, assuming (x6, y6) (shown in FIG. 11) are the coordinates of the hole 12a to be formed after modifying the error corresponding to the pattern 12, the following relations are established:

$$x6 = x4 - (L' - L)/(2\sqrt{1 + a^2}) \quad (4)$$

$$y6 = y4 - a((L' - L)/(2\sqrt{1 + a^2}) \quad (5)$$

Figure 13:
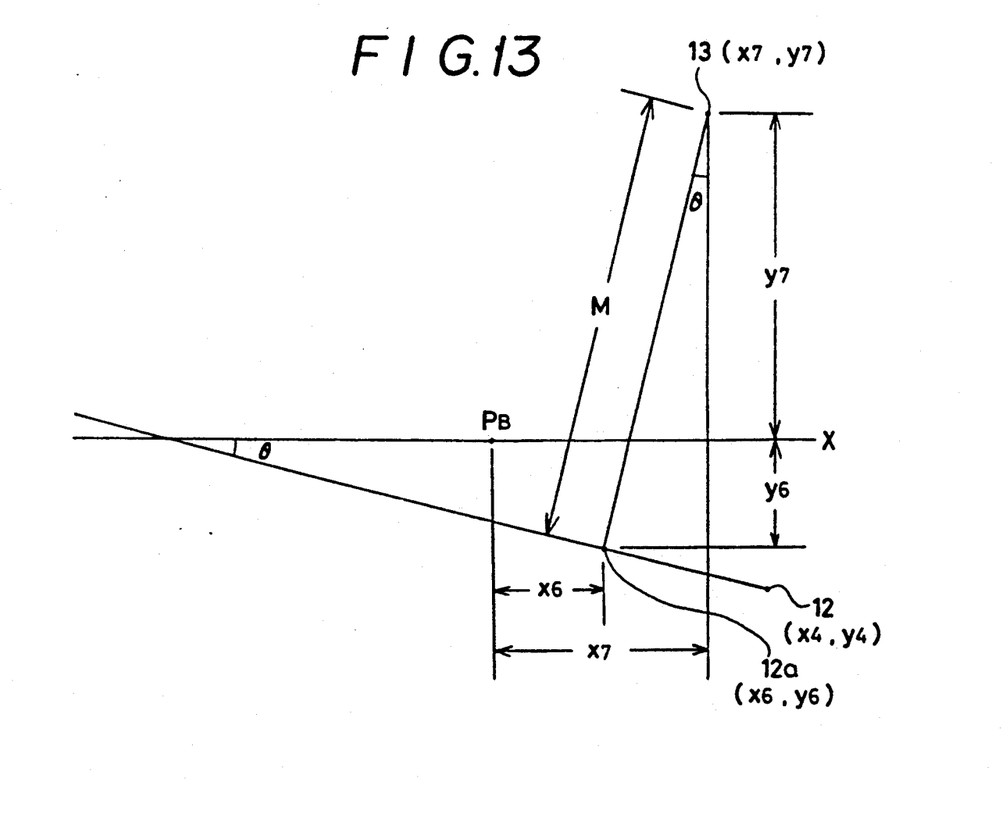

The arithmetic operation for forming a third hole 13 will now be described. The third hole 13 is intended to discern the obverse from the reverse of the board. In this embodiment, the third hole is spaced a distance M away from the above-mentioned hole 12a. The third hole is positioned so that a line which connects the holes 12a, 13 is perpendicular to the holes 11a, 12a. When calculating central coordinates (x7, y7) of the third hole 13, as shown in FIG. 13, the following relations are given:

$$x7 - x6 = M \times \sin\Theta$$
$$y7 - y6 = M \times \cos\Theta$$
when
$$\tan\Theta = a$$

$$\cos\Theta = 1/\sqrt{1 + a^2}$$

$$\sin\Theta = a/\sqrt{1 + a^2}$$

$$x7 = x6 + M \times a/\sqrt{1 + a^2} \quad (6)$$

$$y7 = y6 + M/\sqrt{1 + a^2} \quad (7)$$

or $$x7 = x4 - \{1/(\sqrt{1 + a^2})\}\{(L' - L)/2 - aM\} \quad (6)'$$

$$y7 = y4 - \{1/(\sqrt{1 + a^2})\}\{a(L' - L)/2 - M\} \quad (7)'$$

These arithmetic operations are performed by the arithmetic circuit 71. Therefore, the spacing L' between the patterns 11, 12 is obtained from the formula (1). The coordinates (x5, y5) of the holes 11a, 12a to be formed are obtained from the formulae (2), (3), (4) and (5). The central coordinates (x7, y7) of the hole 13 to be formed are given in accordance with the formulae (6), (7) or (6)', (7)'.

The position of the third hole is not limited to the example given above so that the calculation of the hole position is appropriately set.

Figure 7:
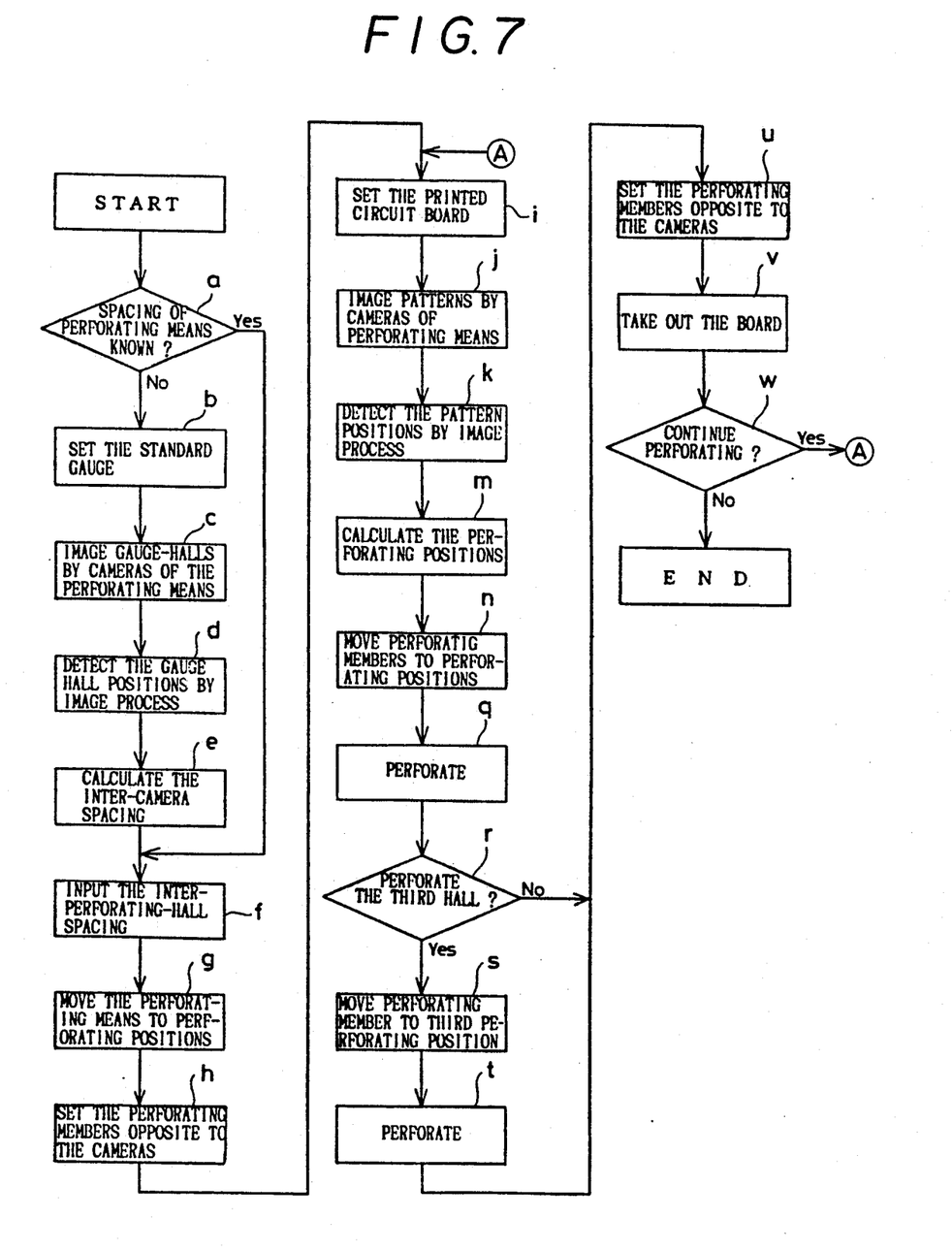
FIG. 7 is a flow chart illustrating the operation of the invention.

Perforating the printed circuit board, according to the invention will now be disclosed with reference to the flowchart of FIG. 7.

If the spacing p between the two perforating devices is not yet known (a), the standard gauge K is set (b). The holes k1, k2 are imaged in the manner described above using the TV cameras 4, 4B (c). The image processing device 5 detects the positions thereof (d). The inter-camera spacing p is calculated in the above-mentioned manner by the arithmetic circuit 71 (e).

On the other hand, when the interperforating-means spacing p is known (a), or when the steps (b)–(e) are finished, the CPU 7 gives the inter-perforating-hole spacing L to the two perforating devices A, B. The perforating devices A, B move to the perforating positions, i.e., the positions at which the TV cameras 4, 4b become coincident with the spacing L (g). Subsequently, perforating members 61, 61B are set opposite to the TV cameras 4, 4B (h). These positions are the initial positions of the two perforating devices A, B.

The printed circuit board 1 to be perforated is now set (i). In the same manner as above discussed, the reference patterns for identifying the perforating positions 11, 12 are imaged by the cameras (j). The image processing device 5 detects the pattern positions (k). As described above, the arithmetic circuit 71 calculates the perforating positions 11a, 12a (m), wherein the error is halved and corrected. The perforating members 61, 61B of the two perforating devices A, B are shifted to these perforating positions under control of the CPU 7 (n). At the same time, two holes are perforated (q).

In order to form the third hole (r), the data of the third perforating position which has been calculated by the arithmetic circuit 71 (m) and stored in this memory circuit 72' is called by the CPU 7. The perforating member 61 or 61B is shifted to the third perforating position under control of the CPU 7 (s), and the perforation of the board is then effected (t). The perforating members 61, 61B return to positions confronting the cameras 4, 4B. If the perforating of the third hole is not performed, the perforating members 61, 61B immediately return to the positions opposite to the cameras 4, 4B (u). Subsequent to this step, the perforating operation is terminated, and the printed circuit board 1 is taken out (v).

When perforating is continuously effected (w), the subsequent printed circuit boards are set (i). The operations described above are repeated. Perforation of the boards is stopped when no printed circuit board to be perforated remains.

The embodiment described above relates to an apparatus in which the light is emitted from below and the camera above the board receives the transmitted image of the pattern. The arrangement of the invention is not limited to this example. In another possible arrangement, the light may be reflected by the printed circuit board, so that the apparatus receives a reflected image thereof. In addition, the perforating member is not limited to the drill, but may employ a punch or the like. The invention is not limited with respect to the manner of driving the perforating members.

The perforating method according to the present invention comprises the steps of detecting the two reference patterns for identifying perforating positions formed on the printed circuit board, calculating the spacing therebetween, calculating an error between this spacing and the predetermined spacing, calculating the perforating positions by halving this error and simultaneously forming the two holes. Therefore, even if a slight error is produced between the pattern positions, the correction is automatically effected. A deteriorated product is thereby not manufactured. The two holes are formed simultaneously, whereby the working time can be reduced.

The perforating apparatus according to the invention is capable of simultaneously detecting the two patterns and effecting the perforation thereof using the pair of perforating devices. Perforating can be accurately and quickly effected. The pair of perforating devices are movable with respect to one another and are therefore adaptable to enable perforation of printed circuit boards having a variety of sizes.

While the invention has been disclosed and described with reference to a single embodiment, it will be apparent that variations and modification may be made therein, and it is therefore intended in the following claims to cover each such variation and modification as falls within the true spirit and scope of the invention.

What is claimed is:

1. A method for perforating a printed circuit board with a pair of perforating devices, using at least two reference patterns for identifying perforating positions preformed on said printed circuit board, comprising the steps of:

locating two perforating means on said perforating devices to separate said perforating means by a predetermined spacing;

imaging said two reference patterns of said printed circuit board with TV cameras;

detecting respective positions of said patterns with an image processing device using image signals obtained during said step of imaging with said TV cameras, to provide a detection result;

calculating a spacing between said patterns in accordance with the result of detection of said pattern positions and said predetermined spacing between said two perforating means;

calculating an error between a prestored interperforating-hole spacing and a calculated inter-pattern spacing;

halving said error;

calculating perforating positions from said patterns which are, after said error has been halved, corrected by said halved values;

moving said perforating means, which are disposed on an XY table provided in each of said perforating devices, to said perforating positions, and perforating said board with said perforating means.

2. The method of claim 1 further comprising the steps of imaging two holes of a standard gauge, which has said two holes perforated at a predetermined spacing, by said pair of TV cameras, detecting the positions of said two holes with said image processing device, and calculating a spacing between said pair of TV cameras using said result of detection.

3. A perforating apparatus for perforating a printed circuit board using at least two reference patterns for identifying preformed perforating positions on said printed circuit board, comprising:

a pair of perforating devices mounted to be movable with respect to one another, said perforating devices having perforating members provided on XY tables, and TV cameras disposed opposite to said perforating members with said printed circuit board therebetween, said TV cameras being capable of imaging said patterns;

an image processing device for detecting the positions of said patterns in accordance with image signals obtained when said TV cameras image said patterns to produce a detection result;

an arithmetic circuit comprising means for calculating an inter-pattern spacing in accordance with detection result of said pattern positions, means for calculating an error between an inter-perforating-hole spacing and said inter-pattern spacing, and means for calculating the perforating positions from said patterns, which are, after halving said error, corrected by said half values;

and a perforating control circuit for moving said perforating members to said perforating positions with said XY tables and causing said perforating members to perforate said board.

4. The perforating apparatus of claim 3, comprising a standard gauge having two holes perforated at a predetermined spacing, said image processing device further comprising means for detecting the positions of said two holes imaged by said pair of TV cameras, and wherein said arithmetic circuit further comprises means for calculating a spacing between said pair of TV cameras using the result of detection of the positions of said two holes.

* * * * *